United States Patent [19]

Kiss

[11] Patent Number: 4,923,524
[45] Date of Patent: May 8, 1990

[54] WIDE RANGING PHOTOVOLTAIC LAMINATES COMPRISING PARTICULATE SEMICONDUCTORS

[75] Inventor: Zoltan J. Kiss, Belle Mead, N.J.

[73] Assignee: Chronar Corp., Princeton, N.J.

[21] Appl. No.: 731,065

[22] Filed: May 6, 1985

[51] Int. Cl.$^5$ .................. H01L 31/04; B32B 7/02; B32B 9/00; B05D 5/12
[52] U.S. Cl. .................. 136/250; 136/258; 428/215; 428/446; 428/699; 427/74; 357/30
[58] Field of Search ............ 428/212, 213, , 215, 428/216, 448, 688, 689, 446, 697, 699, 620, 641, 642; 420/903; 427/86, 87, 93, 74, 427; 29/572, 576; 148/33, 33.3, 33.4, 33.5; 136/250, 249 TJ, 258 AM; 357/30 J, 30 K, 30 N; 437/5

[56] References Cited

U.S. PATENT DOCUMENTS

| | | | |
|---|---|---|---|
| 4,037,014 | 7/1977 | Gittleman et al. | 428/446 X |
| 4,253,882 | 3/1981 | Dalal | 136/249 TJ |
| 4,270,018 | 5/1981 | Gibbons | 136/258 AM |
| 4,292,230 | 9/1981 | Kenney et al. | 428/446 X |
| 4,292,461 | 9/1981 | Hovel | 136/249 TJ |
| 4,336,281 | 6/1982 | van Mourik | 427/75 X |
| 4,370,510 | 1/1983 | Stirn | 148/1.5 X |
| 4,496,788 | 1/1985 | Hamakawa et al. | 136/249 TJ |
| 4,522,663 | 6/1985 | Ovshinsky et al. | 420/903 X |
| 4,604,636 | 8/1986 | Dalal | 136/258 AM |

FOREIGN PATENT DOCUMENTS 0109229 8/1980 Japan .................. 420/903

OTHER PUBLICATIONS

"Electrostatic Spray of Silicon for Photovoltaic Applications" J. F. Mahoney et al., IEEE-IAS Annual Meeting(Oct. 5-9) 1981, pp. 1142-1145, 1981.
Matsumoto et al., "Preparation and Photovoltaic Properties of Screen Printed CdS/Cu$_x$S Solar Cells" Jap J. Appl. Phys, vol. 19, 1980.

Primary Examiner—John E. Kittle
Assistant Examiner—Susan S. Rucker
Attorney, Agent, or Firm—George E. Kersey

[57] ABSTRACT

A photovoltaic laminate of different semiconductor layers for providing a wide range of photovoltaic characteristics. One of the layers is an amorphous semiconductor and at least one other of the layers is of crystalline particles. Additional semiconductor layers, both amorphous and non-amorphous, may be included. The amorphous layers have a thickness of about a few microns and the crystalline layers have a thickness above about 60 microns. The various semiconductor layers can include P, N and intrinsic regions. In accordance with a method aspect of the invention, the particulate layers are produced by blowing a molten semiconductor through a nozzle or by the spin coating of emulsions. The particles are desirably accompanied by a binder in the form of a silicate, an acrylic or a cycloaliphatic epoxy.

10 Claims, 1 Drawing Sheet

WIDE RANGING PHOTOVOLTAIC LAMINATES COMPRISING PARTICULATE SEMICONDUCTORS

BACKGROUND OF THE INVENTION

This invention relates to photovoltaic materials, and, more particularly, to such materials which are active over a wide range of the electromagnetic spectrum.

Photovoltaic materials respond to particular regions of the electromagnetic spectrum to produce an electrical output. Thus amorphous silicon reacts to visible light in the range up to about 6,000 to 7,000 Angstroms. Similarly crystalline silicon is responsive to electromagnetic energy in the range up to about 1.1 to 1.2 microns. Other semiconductors are active in still other regions of the electromagnetic spectrum.

As a result no single semiconductor material is able to make use of the entire spectrum to which it is typically exposed. In addition the conversion efficiency of the spectral energy depends upon the particular semiconductor. Typical values for amorphous silicon range upwardly from about $4\frac{1}{2}\%$. Similarly typical values for crystalline silicon range upwardly from about 6%. It is apparent that in the case of amorphous silicon approximately 95 percent of the excitation energy is unconverted. Likewise, in the case of crystalline silicon, approximately 94 percent of the excitation energy is unconverted.

Although crystalline silicon presently has a greater conversion efficiency than its amorphous counterpart, it is costly to produce and difficult to employ with other semiconductor materials. In particular, crystalline silicon requires a minimum thickness for proper handling that prevents it from being successfully employed with other materials. Thus there is a significant fragility which often leads to breakage and crackage during even the routine handling of amorphous silicon.

Accordingly, it is an object of the invention to make better use of the electromagnetic spectrum in the excitation of semiconductor materials. A related object is to increase the extent to which the excitation spectrum is converted into electricity by semiconductor materials. Another related object is to increase the overall conversion efficiency for electromagnetic energy.

Another object of the invention is to facilitate the employment of crystalline semiconductors. A related object is to facilitate the employment of such semiconductors in combination with other materials. A related object is to reduce the extent of breakage and crackage that is presently encountered in the manipulation of crystalline materials, particularly crystalline semiconductors.

SUMMARY OF THE INVENTION

In accomplishing the foregoing and related objects, the invention provides a photovoltaic laminate of different semiconductor layers. The laminate may include two or more semiconductor layers of different types. Where there are two layers it is desirable for one of them to be an amorphous semiconductor and at least one other to be of crystalline particles. The other layers may include other semiconductors both amorphous and non-amorphous, including amorphous and crystalline germanium, and amorphous and crystalline gallium arsenide.

In accordance with one aspect of the invention a laminate with amorphous layers has a thickness of greater than or equal to a few microns and the crystalline layers, when present, desirably have a thickness greater than or equal to 60 microns. The various semiconductor layers can include p, n and intrinsic regions. They may also be used with such transparent semiconductors as tin oxide and variants.

In accordance with a further aspect of the invention, one or more of the layers formed by particles of semiconductors are produced by the preliminary generation of crystalline particles; for example by the blowing of molten semiconductor through a nozzle or by the spin coating of emulsions. The particles are desirably accompanied by a binder which can take the form of a silicate or an organic such as an acrylic or a cycloaliphatic epoxy. Where curing is desired, this can be achieved during the deposition of other layers which are accompanied by the use of heat and partial vacuum.

In accordance with yet another aspect of the invention, the semiconductor particles are applied to a substrate or to another layer of the laminate by printing. A particularly suitable printing technique involves screening in which a mesh is chosen that exceeds the size of the largest diameter particle included in the particulate composition, and any binders that are present, and the screening operation takes place by squeegeeing and other standard screen printing techniques.

DESCRIPTION OF THE DRAWINGS

Other aspects of the invention will become apparent after consideration of several illustrative embodiments, taken in conjunction with the drawings, in which.

DETAILED DESCRIPTION

Figure 1:
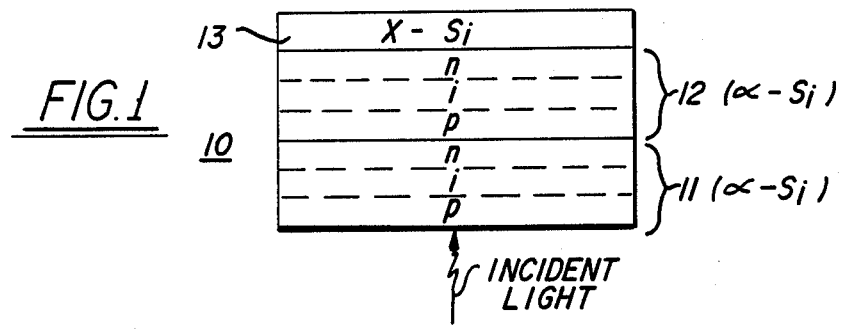
FIG. 1 is a schematic view of a photovoltaic laminate in accordance with the invention.

With reference to the drawings, a photovoltaic laminate 10 in accordance with the invention is illustratively constituted by superimposed semiconductor layers 11, 12 and 13. The lowermost layer 11 is illustratively of amorphous silicon and although described as a "layer" is in fact a sublaminate of p, i and n-type hydrogenated amorphous silicon. In addition, in general practice the amorphous silicon layer 11 would be formed on a substrate such as conductive tin oxide glass which has been omitted from FIG. 1 for simplification. Incident electromagnetic energy, for example visible light, falls on the exposed surface of the amorphous layer 11 and is transmitted through the overall structure 10 to achieve wide ranging photovoltaic conversion. For that purpose the intermediate layer 12 is of amorphous silicon-germanium alloy, again as a p, i, n sublaminate. It is desirable for the layers 11 and 12 to be isolated from one another by a transparent conductive oxide, for example indium tin oxide. Not only does the indium tin oxide provide the desired physical isolation, it also reduces the extend of adverse migration into the amorphous silicon layer 11. The final layer 13 in FIG. 1 is of crystalline silicon particles.

Figure 2:
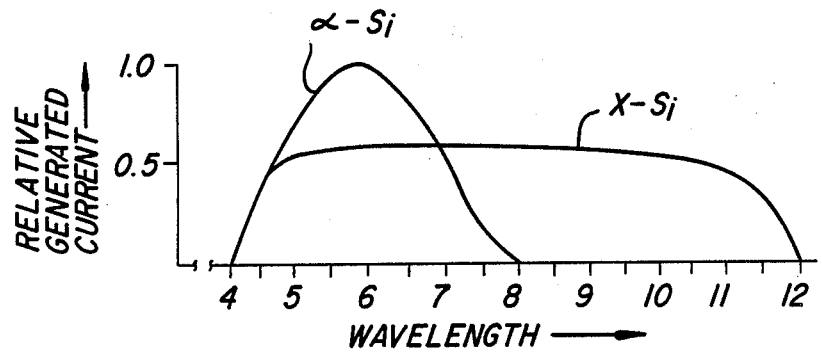
FIG. 2 is a graph of spectral response for the laminate of FIG. 1 illustrating the wide ranging conversion of incident spectral energy to voltage in accordance with the invention.

An illustration of the conversion of incident light L on the layer 11 is depicted in FIG. 2. Spectral energy in the range to about between 6,000 and 7,000 Angstroms activates the amorphous silicon layer 11 with an efficiency on the order of 4.5 percent. The remaining spectral energy passes into the intermediate amorphous silicon-germanium layer 12 and is there converted with an efficiency on the order of 4.5 percent for spectral energy in the range above about 6,000 to 1.1 microns. (11,000 Angstrom units). The light L which is unconverted continues its passage through the device and that in the range from 1.1 to 1.2 microns is converted with an efficiency about 6 percent. Consequently, the efficiency of the overall device 10 approaches 15 percent, representing a significant improvement over the efficiencies encountered with semiconductor photovoltaics employing a single kind of semiconductor material.

It will be appreciated that even with the omission of the intermediate layer 12 and the restriction of the device to an amorphous base layer 11 and a superimposed crystalline layer 13, the overall efficiency of the device, which represents a tandem connection of the successive layers, is over 10 percent. This of itself represents a significant increase over the efficiencies encountered with monomeric semiconductors. In effect the invention provides a polymeric semiconductor structure in the sense that the successive layers are different monomers.

Figure 3:
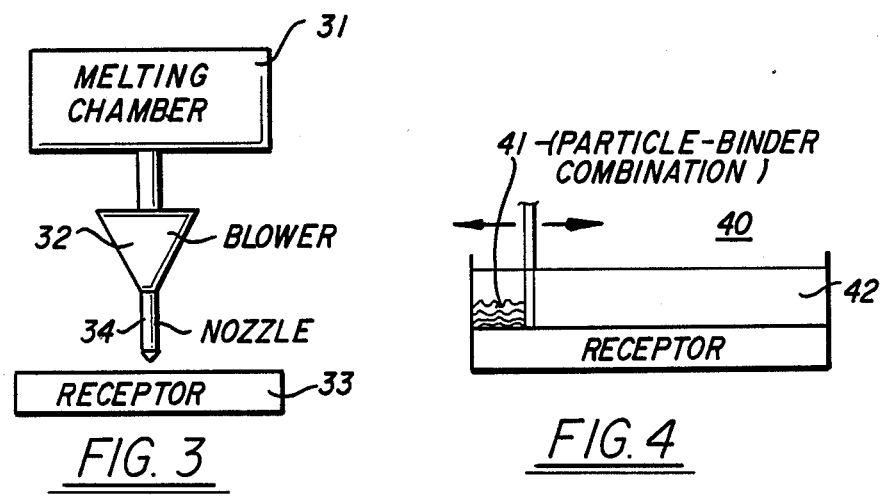
FIG. 3 is a schematic representation of a blowing technique for producing crystalline particles for incorporation into a photovoltaic laminate pursuant to the invention.

Various techniques are available for producing crystalline particles. As illustrated in FIG. 3, a blowing arrangement 30 includes a melting chamber 31 which converts standard, properly doped, crystalline semiconductors to molten form. The molten material is applied to a blower 32 which sprays the molten semiconductor material on a receptor 33. During the transit of the molten material from the blower nozzle 34 to the receptor 33 the fluid stream forms particles. Control over particle size is achieved by control of the pressure in the region between the nozzle 34 and the receptor 33. In order to achieve small size particles, a counterstream can be directed against the output of the nozzle to produce a further partition of the particles that are formed upon emmission from the nozzle 34. Other techniques may be employed as well, including such techniques as electrophoresis. A suitable particle size is on the order of 60 microns, but smaller and larger particles may be used as well.

Figure 4:
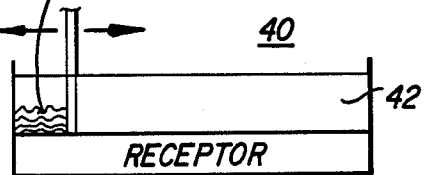
FIG. 4 is a schematic representation of a screen printing technique for particulate semiconductor materials in accordance with the invention.

Once crystalline particles have been formed, they are applied to the laminate in a variety of ways. FIG. 4 illustrates screen printing in which the crystalline particles are mixed with a binder, which may also be particulate, such as a silicate, and the particle binder combination 41 is applied to a screen unit 42 of the screen printer 40 in FIG. 4. Once the printing has taken place, the particle layer can be cured as a preliminary step in the further processing of the laminate in a standard deposition chamber where the other layers, e.g. 11 and 12, are produced. Besides screen printing, techniques such as spin coating where the particles are formed into an emulsion, may be employed and subsequent curing can take place as described above for screen printing.

It will be understood that the foregoing description is merely illustrative and that persons of ordinary skill in the art, given the benefit of the foregoing disclosure, will realize numerous other modifications and implementations of the invention.

What is claimed is:

1. A photovoltaic laminate which is responsive to a wide range of the electromagnetic spectrum, comprising amorphous and crystalline semiconductor layers, at least one of which is particulate gallium arsenide.

2. A photovoltaic laminate which is responsive to a wide range of the electric magnetic spectrum, comprising a plurality of different semiconductor layers, at least one of the layers being of amorphous semiconductor, and at least another of the layers being of particulate crystalline silicon, with the amorphous layer having a thickness above about 1 micron and the crystalline layer having a thickness above about 60 microns.

3. A photovoltaic laminate comprising a plurality of layers formed by mutually contacting particles selected from the class of silicon, germanium alloys and gallium arsenide.

4. A photovoltaic laminate which is responsive to a wide range of the electromagnetic spectrum, comprising a plurality of different semiconductor layers, including at least two layers of amorphous semiconductor and another layer of crystalline semiconductor in particulate form.

5. The method of forming a photovoltaic laminate which is responsive to a wide range of the electromagnetic spectrum, comprising the steps of
   (a) forming a layer of amorphous or crystalline semiconductor; and
   (b) superimposing, upon the layer of step (a), a second layer of an opposite crystalline or amorphous structure;
   wherein the layer of crystalline semiconductor is deposited in particulate form, by blowing molten semiconductor through a nozzle subjected to a counterstream.

6. The method of claim 5 further including the step of forming a third layer upon the other two layers, the third layer being of a different semiconductor than either of the other two.

7. The method of claim 5 wherein the particles of semiconductor are accompanied by binders.

8. The method of claim 7 wherein the binder is selected from the class of silicates and organics including acrylics, and cycloaliphatic epoxys.

9. The method of forming a photovoltaic laminate which is responsive to a wide range of the electromagnetic spectrum comprising the steps of
   (a) forming a layer of amorphous or crystalline silicon semiconductor; and
   (b) superimposing upon step (a) a second layer of opposite crystalline or amorpous structure;
   said crystalline silicon semiconductor being in particulate form and applied by printing.

10. The method of claim 9 wherein the printing takes place by screening.

* * * * *